United States Patent
Wunderer (10) Patent No.: US 11,133,649 B2
(45) Date of Patent: Sep. 28, 2021

(54) INDEX AND GAIN COUPLED DISTRIBUTED FEEDBACK LASER

(71) Applicant: Palo Alto Research Center Incorporated, Palo Alto, CA (US)

(72) Inventor: Thomas Wunderer, Santa Cruz, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 129 days.

(21) Appl. No.: 16/448,415

(22) Filed: Jun. 21, 2019

(65) Prior Publication Data

US 2020/0403375 A1 Dec. 24, 2020

(51) Int. Cl.
H01S 5/12 (2021.01)
H01S 5/20 (2006.01)

(52) U.S. Cl.
CPC ............ H01S 5/1228 (2013.01); H01S 5/204 (2013.01); H01S 5/2031 (2013.01)

(58) Field of Classification Search
CPC ..... H01S 5/1228; H01S 5/1234; H01S 5/1231
See application file for complete search history.

(56) References Cited

U.S. PATENT DOCUMENTS

| | | | | |
|---|---|---|---|---|
| 4,400,813 A | * | 8/1983 | Kaminow | H01S 5/22 372/45.01 |
| 5,077,752 A | * | 12/1991 | Tada | H01S 5/34 372/96 |
| 5,297,158 A | * | 3/1994 | Naitou | H01S 5/2231 372/45.01 |
| 5,452,318 A | * | 9/1995 | Makino | H01S 5/1228 372/45.01 |
| 5,703,899 A | * | 12/1997 | Mizutani | H01S 5/1228 372/50.1 |
| 5,821,570 A | * | 10/1998 | Kazmierski | G02F 1/025 257/97 |
| 5,872,022 A | * | 2/1999 | Motoda | B82Y 20/00 438/39 |

(Continued)

FOREIGN PATENT DOCUMENTS

| | | | |
|---|---|---|---|
| CN | 108110614 A | * | 6/2018 |
| CN | 109462144 A | * | 3/2019 |

(Continued)

OTHER PUBLICATIONS

Teng et al., "Complex-Coupled DFB Laser Using a Buried SiO2 Grating", Feb. 15, 2008, IEEE Photonics Technology Letters, vol. 20, No. 4, 231-233. (Year: 2008).*

(Continued)

*Primary Examiner* — Joshua King
(74) *Attorney, Agent, or Firm* — Mueting Raasch Group (57) ABSTRACT

A laser includes an active region surrounded by first and second waveguide layers. Two or more mask openings are formed within a dielectric layer on a surface parallel to the active region. A refractive grating is formed on the dielectric mask openings and includes three-dimensional grating features spaced apart in the light-propagation direction of the laser. The refractive grating provides modulation of a real part of the effective refractive index of the laser and modulation of the imaginary part is provided by modulation of the current flow through the mask openings.

20 Claims, 8 Drawing Sheets

(56) References Cited

U.S. PATENT DOCUMENTS

| | | | |
|---|---|---|---|
| 5,953,361 A | | 9/1999 | Borchert et al. |
| 6,026,110 A | * | 2/2000 | Makino .................. H01S 5/1228 372/46.01 |
| 6,201,824 B1 | | 3/2001 | Hong et al. |
| 6,560,259 B1 | | 5/2003 | Hwang |
| 6,643,309 B1 | * | 11/2003 | Gotoda .............. H01S 5/06258 372/50.11 |
| 7,646,797 B1 | * | 1/2010 | Hoffman .............. H01S 5/1228 372/46.01 |
| 7,855,093 B2 | * | 12/2010 | Okamoto .................. H01S 5/12 438/32 |
| 9,372,306 B1 | * | 6/2016 | Nagarajan ............... G02F 1/025 |
| 2002/0039375 A1 | * | 4/2002 | Shoji ...................... H01S 5/1228 372/46.01 |
| 2002/0064199 A1 | * | 5/2002 | Takei ...................... B82Y 20/00 372/46.012 |
| 2002/0093013 A1 | * | 7/2002 | Charles .................. B82Y 20/00 257/27 |
| 2005/0276557 A1 | * | 12/2005 | Bour ........................ H01S 5/12 385/131 |
| 2006/0109884 A1 | | 5/2006 | Kim et al. |
| 2009/0047751 A1 | * | 2/2009 | Yoshimoto .......... H01S 5/34333 438/32 |
| 2010/0074292 A1 | * | 3/2010 | Bour ................... H01S 5/34333 372/45.011 |
| 2011/0235664 A1 | * | 9/2011 | Illek .......................... H01S 5/12 372/44.01 |
| 2013/0039664 A1 | * | 2/2013 | Clifton .................. B82Y 20/00 398/200 |
| 2014/0097456 A1 | * | 4/2014 | Kawashima .......... H01L 27/156 257/94 |

FOREIGN PATENT DOCUMENTS

| | | | | |
|---|---|---|---|---|
| EP | 0614254 A1 | * | 9/1994 | ........... H01S 5/1228 |
| GB | 2286288 A | * | 8/1995 | ............. B82Y 20/00 |
| JP | 60247986 A | * | 12/1985 | ........... H01S 5/1228 |
| KR | 20170042462 A | * | 4/2017 | |

OTHER PUBLICATIONS

Ke et al., "Parity-Time Symmetric Complex-Coupled Distributed Feedback Laser with Excellent Immunity to External Optical Feedback", Mar. 8, 2017, AIP Advances, 7, 035010. (Year: 2017).*

Weyers et al., "Epitaxy of High-Power Diode Laser Structures", High-Power Diode Lasers, 2000, Topics Appl. Phys., 78, 83-120. (Year: 2000).*

Paliwal et al., "Critical Analysis of Step-Graded Polarisation Engineered Electron-Blocking Layer Optimisation for InGaN MQW Laser Diode", May 23, 2019, IET Optoelectronics, vol. 13, iss. 5, 254-258. (Year: 2019).*

Gibart, "Metal Organic Vapour Phase Epitaxy of GaN and Lateral Overgrowth", Reports on Progress in Physics, vol. 67, 2004, pp. 667-715.

Lowery et al., "Performance Comparison of Gain-Coupled and Index-Coupled DFB Semiconductor Lasers", IEEE Journal of Quantum Electronics, vol. 303, No. 9, Sep. 1994, pp. 2051-2063.

Zeller et al., "DFB Lasers Between 760 nm and 16 um for Sensing Applications", Sensors, vol. 10, 2010, pp. 2492-2510.

* cited by examiner

INDEX AND GAIN COUPLED DISTRIBUTED FEEDBACK LASER

SUMMARY

The present disclosure is directed to an index and gain coupled distributed feedback laser. In one embodiment, a laser includes an active region layer surrounded by first and second waveguide layers. The active region extends along a light-propagation direction of the laser. Two or more mask openings are formed within a dielectric layer on a surface parallel to the active region. The mask openings extending normal to the light-propagation direction and are spaced apart in the light-propagation direction. The mask openings modulate a current flow into the active region, thus, modulating the imaginary part of the refractive index of the laser. A refractive grating is formed on the dielectric mask openings and includes three-dimensional grating features spaced apart in the light-propagation direction of the laser. The refractive grating provides modulation of the real part of the effective refractive index of the laser. The active region, first and second waveguide layers, and three-dimensional refractive grating may be formed of III-V semiconductors. The III-V semiconductors may include combinations of two or more of Al, Ga, In, and N.

In another embodiment, a method of forming a laser, involves forming, on a substrate, a first epitaxial part of the laser that includes at least an active region layer surrounded by first and second waveguide layers. A dielectric layer is formed over the first epitaxial part. Two or more mask openings are patterned within the dielectric layer. The mask openings extend normal to a light-propagation direction of the laser and are spaced apart in the light-propagation direction of the laser. A second epitaxial part of the laser is formed in the mask openings using selective area epitaxy. The second epitaxial part includes a refractive grating with three-dimensional grating features.

These and other features and aspects of various embodiments may be understood in view of the following detailed discussion and accompanying drawings.

BRIEF DESCRIPTION OF THE DRAWINGS

The discussion below makes reference to the following figures, wherein the same reference number may be used to identify the similar/same component in multiple figures.

DETAILED DESCRIPTION

The present disclosure is generally related to semiconductor lasers. In particular, the disclosure describes the structure and fabrication of a specialized distributed feedback (DFB) laser that is both index-coupled and gain-coupled. The structure of the laser can result in laser light being emitted with a particularly narrow linewidth and good side mode suppression. It is also robust against environmental fluctuations. Applications for such a DFB laser can include, among other things, spectroscopy, communication, and atom/ion interaction (atomic clocks, quantum computing, etc.).

Generally, DFB lasers are either index-coupled (modulation of real part of refractive index) or complex-coupled (modulation of imaginary part of the refractive index). Modulation of the real part of the refractive index is typically achieved by etching a diffraction grating into the semiconductor material. For example, the pattern can be etched into the top cladding of the heterostructure resulting in a semiconductor/air grating. Or the grating can be placed closer to the active zone (e.g., etching of lower cladding) and the rest of the laser heterostructure is epitaxially overgrown. In such a case, the grating is embedded in the heterostructure and not necessarily observable at the surface.

Modulation of the imaginary part of the refractive index can be realized by modulation of either the gain (e.g., through patterning of active zone) or the loss (e.g., with a metal grid on the surface that adds modulated absorption losses). In any case, lasing of one (or two w/o phase shifter) specific longitudinal mode(s) is supported in DFB-type lasers. For various applications, pure single-mode operation with a narrow emission linewidth is useful for accessing the full potential of the application (e.g., spectroscopy, communication, atom/ion interaction, etc.). A laser described below can induce modulation in both the imaginary and real part of the refractive index, thereby providing improvements in device performance in terms of linewidth, mode stability, threshold, etc.

Figure 1:
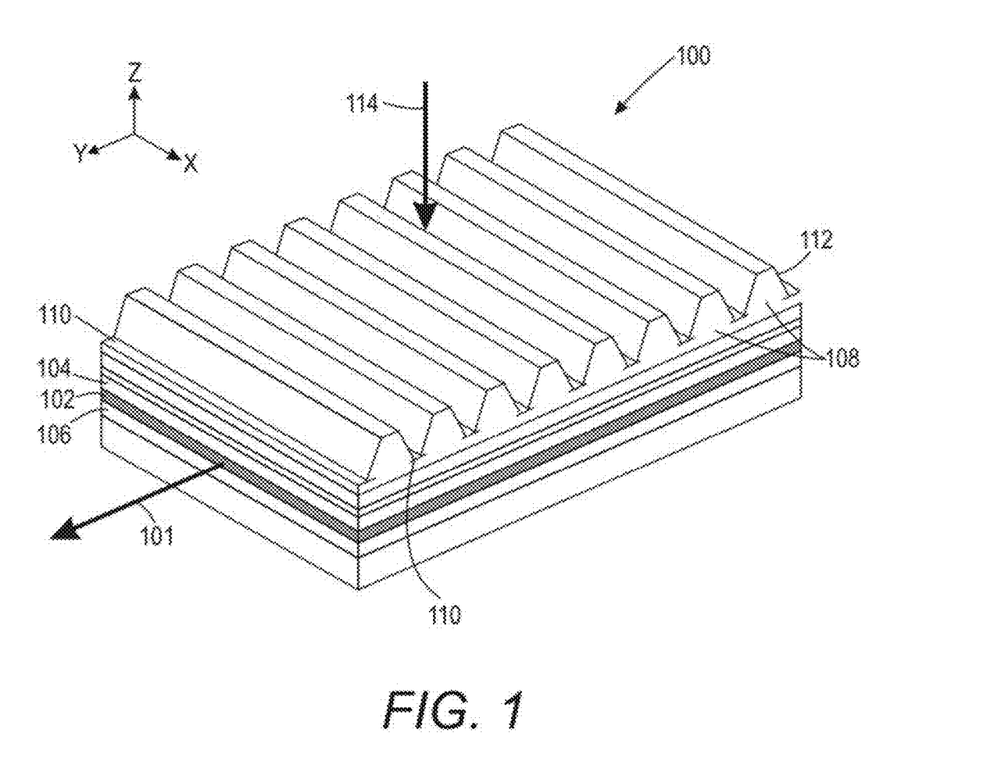
FIG. 1 is a perspective view of a laser according to an example embodiment.

In FIG. 1, a perspective view shows a laser diode 100 according to an example embodiment. The laser diode 100 includes an active region layer 102 surrounded by first and second waveguide layers 104, 106. The active region extends along a light-propagation direction 101 of the laser 100, which corresponds to the Y-direction in this figure. Two or more mask openings 108 are formed within a dielectric layer 110 on a surface parallel to the active region 102.

The mask openings extend normal to the light-propagation direction (along the X-direction in this example) and are spaced apart in the light-propagation direction of the laser. The mask openings 108 modulate a current flow into the active region. A three-dimensional refractive grating 112 is formed out of the dielectric mask openings via selective area epitaxy with proper adjustments of the growth conditions. The refractive grating 112 include grating features (e.g., trapezoidal stripes in this example) spaced apart in the light-propagation direction of the laser 100. Other shapes for the grating include stripes/channels with triangular or rectangular cross-sections. The refractive grating 112 provides modulation of the real part of the effective refractive index of the laser heterostructure. Arrow 114 represents a current that flows through the layers of the laser diode 100. The laser diode 100 would generally be packaged together with electrodes (anode, cathode), electrical contact layers, outer casing/coating, etc. These additional features are known in the art and so are not illustrated here.

Figure 2:
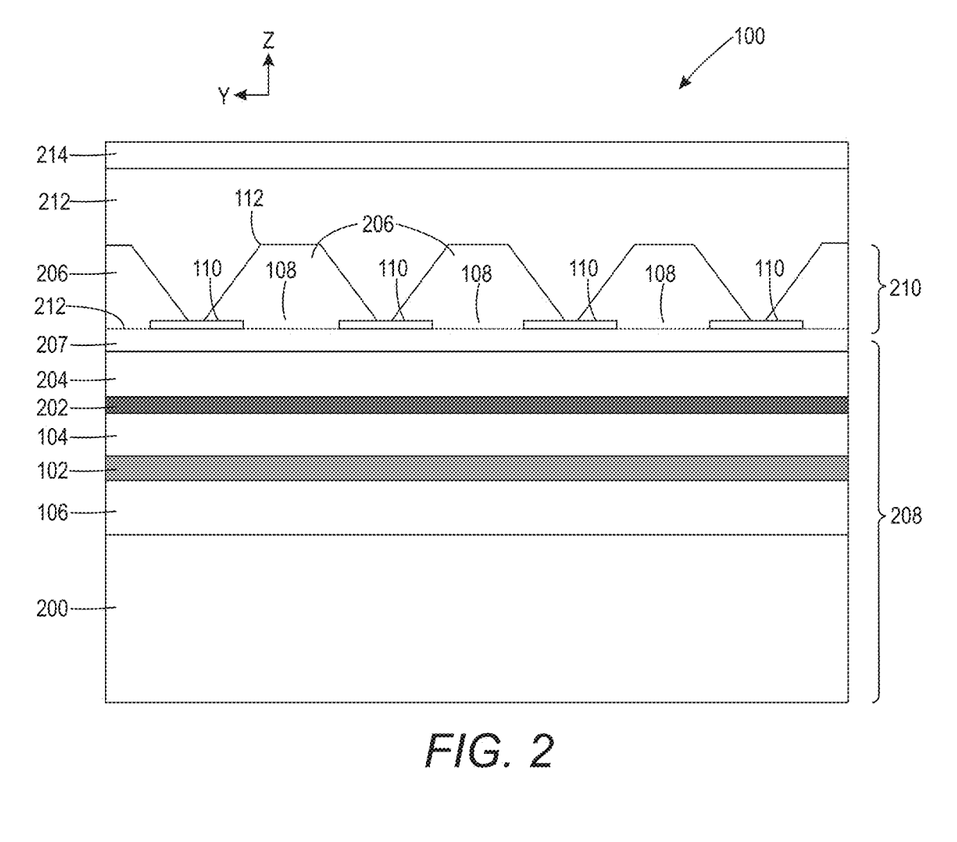
FIG. 2 is a side view showing grating features of a laser according to an example embodiment.

In FIG. 2, a side view shows features of the refractive grating 112 and mask openings 118 according to an example embodiment. In addition to those features seen in FIG. 1, this view shows an electron blocking layer (EBL) 202 surrounded by waveguide layers 104, 204. The EBL 202 improves the confinement capability of electrons within the quantum wells (active region 102). The waveguide layer 106 is shown on top of a cladding layer 200. The regions 206, 207 above and below the dielectric layer 110 are also formed of a cladding material. In this example, the semiconductor structures used to form the laser structure are III-V semiconductors, e.g., compounds of Ga, In, Al, and N. For example, waveguide layers 104, 204 may be formed of (Al)Ga(In)N p-waveguide material and waveguide layer 106 may be formed of (Al)Ga(In)N n-waveguide material. Material for layer 200 may be AlGaN n-cladding and material for layers 206 and 207 may be AlGaN p-cladding, respectively. The EBL 202 may also be formed of AlGaN. In other embodiments, other III-V materials such as AlGaInAs, AlGaInP, or AlGaInSb, or group II-VI materials may be used for the epitaxial layers 104, 106, 200, 202, 204, 206, and 207. The dielectric layer 110 may be formed of $SiO_2$ or other amorphous, dielectric material, that can act as selective area mask material, including SiN, TiO2, HfO2, TiN, etc.

Also seen in FIG. 2 is an optional cover layer 212 on top of the 3-D refractive grating 112. Depending on the exact geometry of the grating 112 and materials selection, an additional film between the grating 112 and metal contact 214 might be beneficial for optimal laser performance. There could be multiple metal contacts 214, e.g., top mounted anode and cathode. The additional film 212 would be electrically conductive and feature low absorption loss at the target laser emission wavelength. The layer 212 would have a different refractive index than the grating 112, either higher or lower, but preferably lower. For example ITO (indium tin oxide) would be one of the materials candidates. An ITO layer would have a relatively small refractive index (in comparison to GaN), thus, pushing the laser mode closer to the active zone 102 and away from the highly absorbing metal contacts 214. As a consequence, the cover layer 212 can reduce absorption losses, reducing laser threshold and improving overall device efficiency. This additional layer 212 might lead to a more planarized top surface, thus aid in maintaining tighter dimensional tolerances for the laser package.

Figure 3:
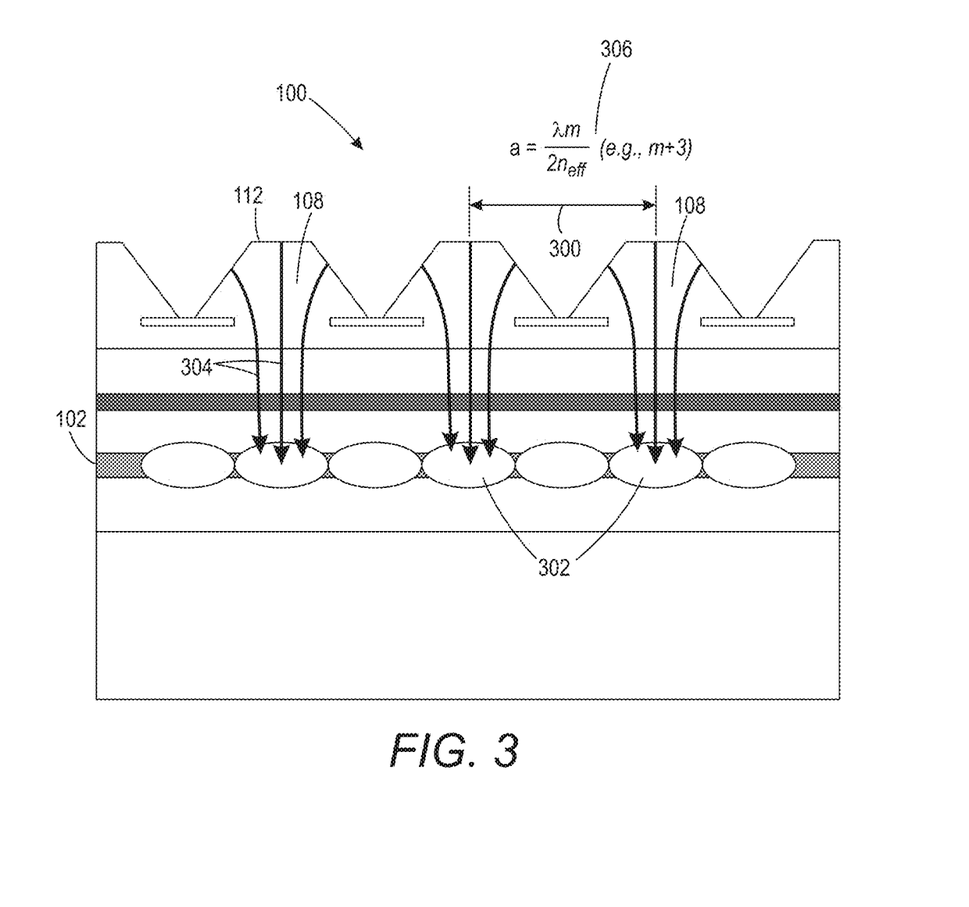
FIG. 3 is a side view showing modulated current injection and mode of a laser according to an example embodiment.
Figure 4:
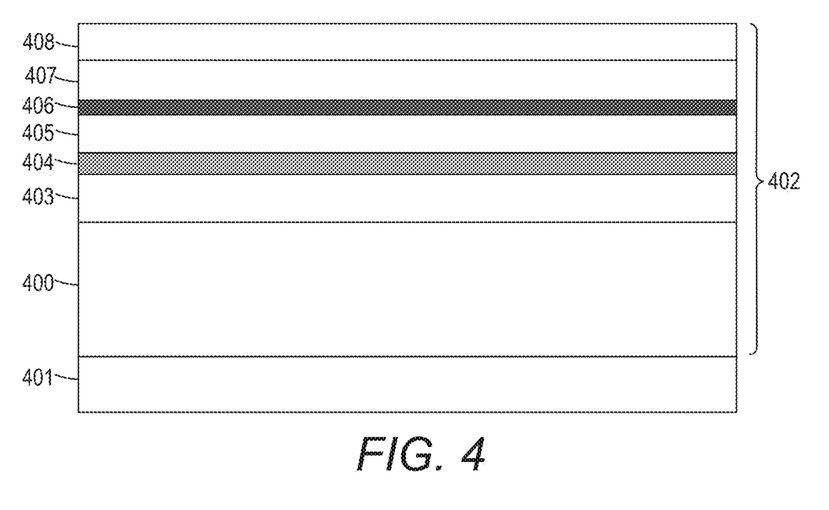
FIGS. 4-7 are diagrams showing the formation of a laser according to an example embodiment.

In FIG. 3, a diagram of the DFB laser 100 schematically shows modulated current injection and laser mode. The spacing 300 between peaks of the refractive grating 112 are based on the indicated expression 306, which depends on the effective refractive index $n_{eff}$ of the heterostructure and laser wavelength $\lambda$. The period of the grating 112 is selected to be a multiple of half the material wavelength, which is the vacuum wavelength divided by the refractive index. In this case the laser mode experiences a stack of multiple materials with different thicknesses (e.g., active layer 102, waveguide 104, part of the cladding 207) where the mode intensity varies based on the position. Thus, it is not only one material with a fixed refractive index. However, for simplification the light propagation within the heterostructure can be described with an effective refractive index for the ensemble of materials. The laser mode is represented by ovals 302 and arrows 304 represent a modulated current flow through the mask openings 108 and into the active region 102. Together, these confine the mode 302 of the laser and result in a narrower emission linewidth than would result of the refractive grating 112 or openings 108 were used alone.

The laser grating 112 may be formed using selective area epitaxy, which involves growing an epitaxial layer in targeted regions through voids in a patterned amorphous dielectric mask. In reference again to FIG. 2, the epitaxy of the laser heterostructure is split into two parts 208, 210. Both of these parts 208, 210 may be formed using metalorganic vapor-phase epitaxy (MOVPE), although another technique such as molecular beam epitaxy (MBE) may be used. In a first epitaxy run that forms part 208, the device layers 200, 106, 102, 104, 202, 204 and 207 are grown in a conventional unpatterned manner. As indicated by dashed line 212, the growth is interrupted in the upper part of the heterostructure, e.g., after the cladding layer 207. A dielectric mask material (e.g., $SiO_2$) is deposited (e.g., via plasma-enhanced chemical vapor deposition, atomic layer deposition, sputtering) and patterned (e.g., e-beam lithography and reactive-ion etching) outside of the III-V growth chamber.

In a subsequent second epitaxial run the laser heterostructure, which includes part 210 is completed. Growth conditions are chosen for development of 3-D structures (e.g., nano-stripes with trapezoidal cross section) via selective area epitaxy. For example, this technique is described in "Metal organic vapour phase epitaxy of GaN and lateral overgrowth" by Pierre Gibart 2004 Rep. Prog. Phys. 67 667 for the goal of improving the GaN material property through reduction of threading dislocations. Here, selective area epitaxy is used as fabrication method that allows forming the shape of the refractive grating 112 without etching or milling. The patterned dielectric 110 not only acts as mask material for the selective area growth, but also fulfills the function of current confinement due to its electrically insulating property.

In FIGS. 4-8, block diagrams illustrate the formation of a DFB laser according to an example embodiment. The laser is formed on a substrate 401 although in some embodiments cladding layer 400 may be used as the substrate. A first epitaxial part 402 of the laser is formed on the substrate 401. The first epitaxial part 402 of the laser includes at least an active region layer 404 surrounded by first and second waveguide layers 403, 405. This part 402 also includes an EBL 406, waveguide layer 407, and a cladding layer 408. As noted above, the lower cladding 400 may be included in the first epitaxial part 402 or may be considered a substrate.

Figure 5:
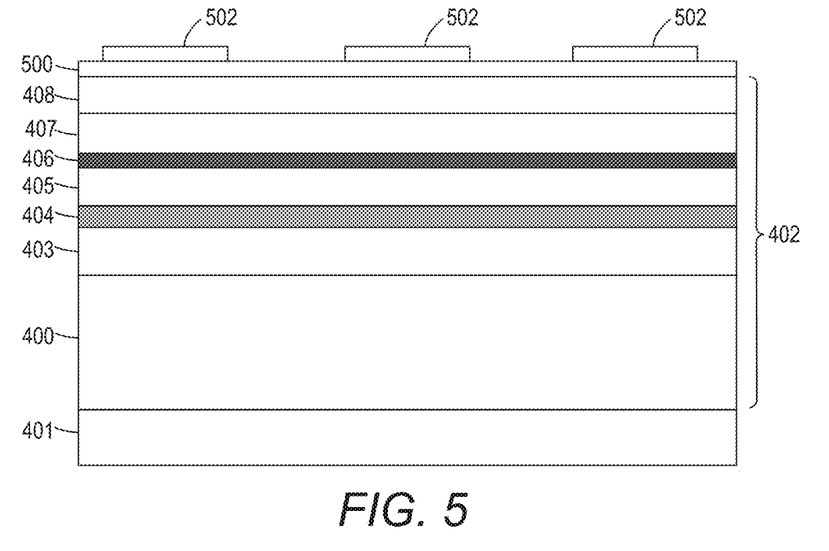

As seen in FIG. 5, a dielectric layer 500 is formed over the first epitaxial part 402. On top of this dielectric layer 500, a mask 502 is formed, e.g., using photolithography. This may involve coating layer 500 with a masking material, and exposing certain areas of the masking material to electromagnetic energy (e.g., light, x-rays) through a photomask, or direct writing using an electron beam, which causes the exposed areas to be removed, e.g., via a chemical treatment. Alternatively, using other types of resist, the areas that were exposed are hardened and those areas not exposed are removed. Thereafter, the areas of masking material that were not removed form the mask 502.

Figure 6:
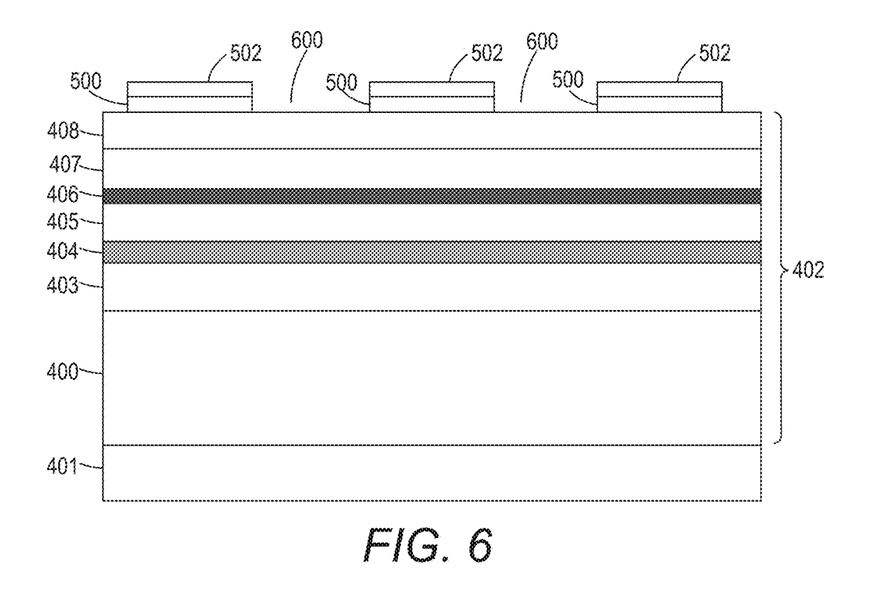

As seen in FIG. 6, the mask 502 and dielectric layer 500 are subjected to an etching process (e.g., reactive-ion etching), which removes portions of the dielectric layer 500 that are not covered by the mask 502. This results in two or more mask openings 600 within the dielectric layer 500. The mask openings 600 extend normal the page in this view. The openings are also normal to a light-propagation direction of the laser (left to right in this view) and are spaced apart in the light-propagation direction of the laser. The mask 502 can be removed at this stage, e.g., via wet etching.

Figure 7:
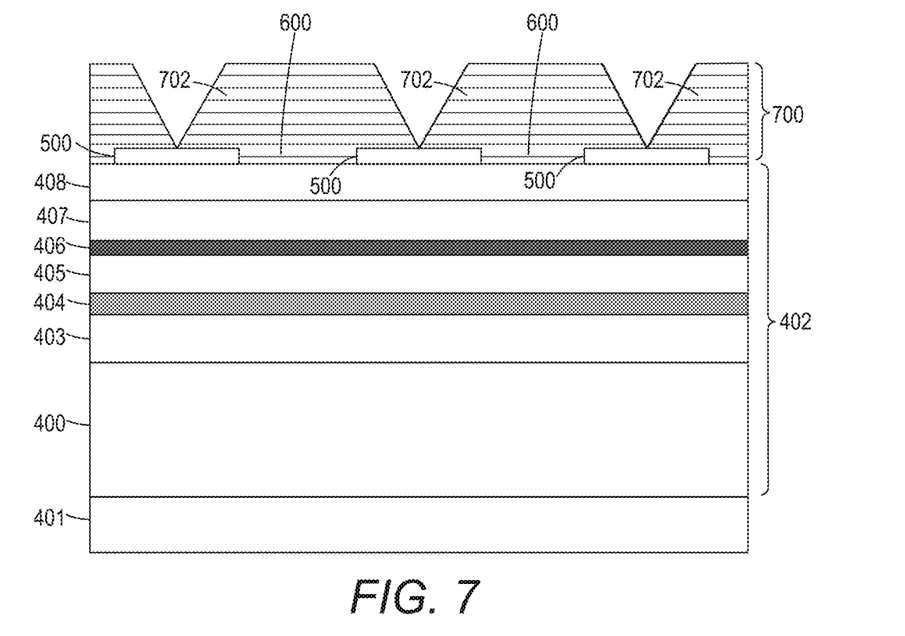

As seen in FIG. 7, a second epitaxial part 700 of the laser is formed on the dielectric layer 500. The second epitaxial part 700 is grown using selective area epitaxy. Individual layer, indicated by the dashed lines, are deposited to form a three-dimensional, refractive grating comprising grating features 702 (e.g., trapezoidal channels extending normal to the plane of the page) that are spaced apart in the light-propagation direction of the laser. This technique results in atomically smooth surfaces through epitaxial growth with no etching-induced structural damage. Further, this technique is tolerant to imperfections in fabrication of the mask 500 and openings 600. While not shown, an additional cover layer (e.g., layer 212 shown in FIG. 2) can be deposited over the grating features 702. This may be a material such as ITO, and depending on the material may be deposited using an epitaxial process or other process (e.g., plasma-enhanced chemical vapor deposition, atomic layer deposition, sputtering). This may be followed by other layers, such as electrical contacts on the outer surface of the laser diode.

There may be variations on the processes shown in FIGS. 4-7. For example, the growth interruption that occurs between FIGS. 4 and 5 could also be placed at some other locations, e.g. closer or further away from the active zone 404. In another embodiment, the quantum well/active zone could be grown in a patterned manner. This would likely involve changing the location and/or composition of layers surrounding the active zone.

Figure 8:
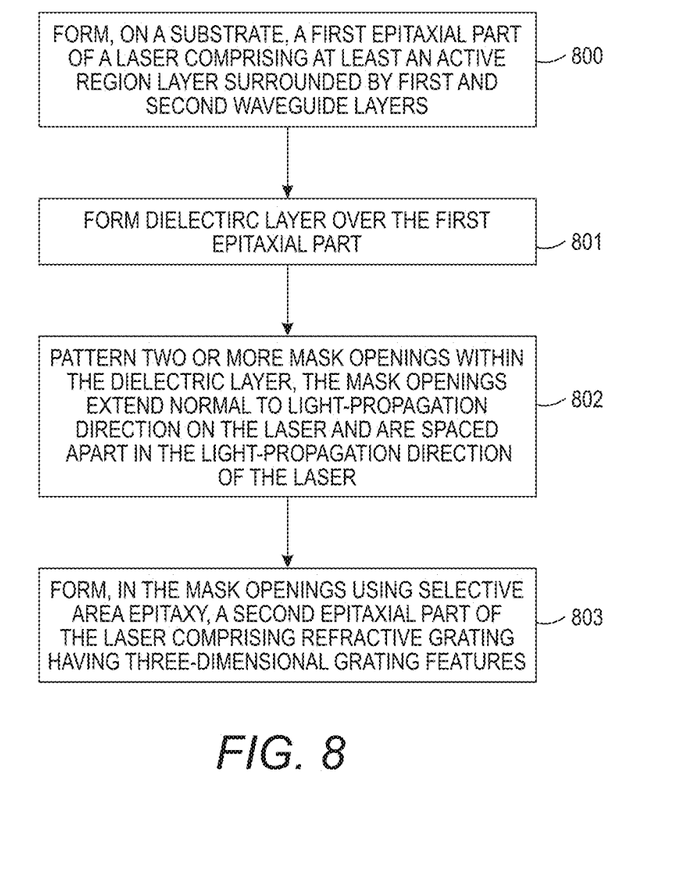
FIGS. 8 and 9 are flowcharts of methods according to example embodiments.

In FIG. 8, a flowchart shows a method of forming a laser according to an example embodiment. The method involves forming 800, on a substrate, a first epitaxial part of the laser comprising at least an active region layer surrounded by first and second waveguide layers. A dielectric layer is formed 801 over the first epitaxial part. Two or more mask openings are patterned 802 within the dielectric layer. The mask openings extend normal to a light-propagation direction of the laser and are spaced apart in the light-propagation direction of the laser. A second epitaxial part of the laser comprising a refractive grating with three-dimensional grating features is formed 803 in the mask openings using selective area epitaxy.

Figure 9:
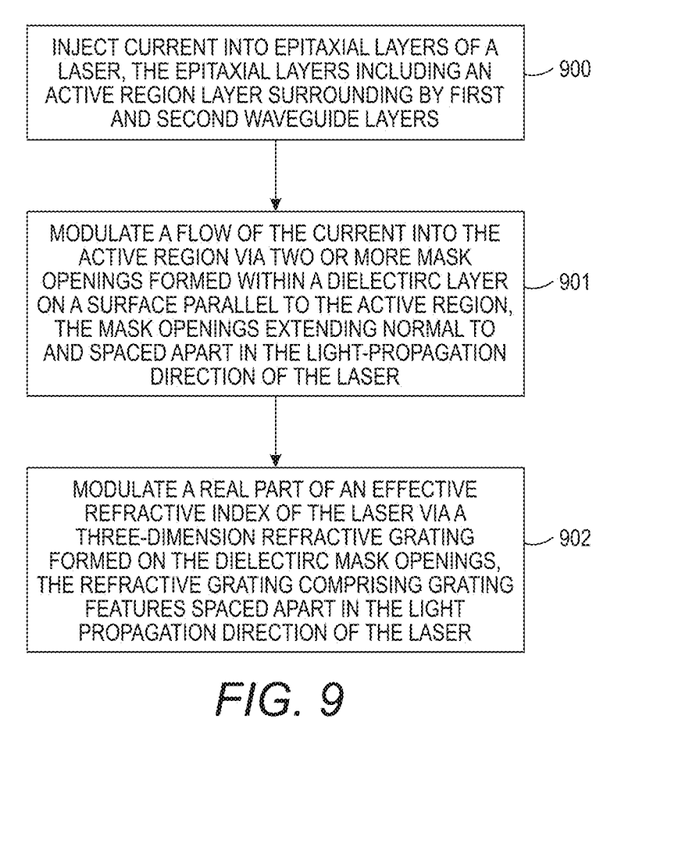

In FIG. 9, a flowchart shows a method of using a laser according to an example embodiment. The method involves injecting 900 current into epitaxial layers of a laser. The epitaxial layers include an active region layer surrounded by first and second waveguide layers. The active region extends along a light-propagation direction of the laser. A current flow into the active region is modulated 901 via two or more mask openings formed within a dielectric layer on a surface parallel to the active region. The mask openings extend normal to the light-propagation direction and are spaced apart in the light-propagation direction of the laser. A real part of an effective refractive index of the laser is modulated 902 via a refractive grating formed on the dielectric mask openings. The refractive grating includes three-dimension grating features spaced apart in the light-propagation direction of the laser.

In summary, DFB laser is described with modulation of both the real and imaginary part of the refractive index. The laser achieves index—and complex-coupling—modulation of both real and imaginary part of the refractive index using structural modulation via a 3-D periodic pattern and gain modulation through periodic, lateral current confinement. Strong light-matter coupling enables single-mode laser operation with narrow emission linewidth.

A fabrication technique is also disclosed for manufacturing the DFB laser. In this procedure, selective area epitaxy 3-D growth has advantages compared to etching that is conventionally used to form 3-D grating features. The proposed technique can achieve atomically smooth surfaces with no etch damage. It is also anticipated that imperfections in the fabrication of the sub-micron sized growth mask can be partially neutralized in the epitaxial growth step resulting in a more homogeneous diffraction grating. Strain management through selective area epitaxy avoids severe crack formation that otherwise results from tensile-strained AlGaN films (on GaN).

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein. The use of numerical ranges by endpoints includes all numbers within that range (e.g. 1 to 5 includes 1, 1.5, 2, 2.75, 3, 3.80, 4, and 5) and any range within that range.

The foregoing description of the example embodiments has been presented for the purposes of illustration and description. It is not intended to be exhaustive or to limit the embodiments to the precise form disclosed. Many modifications and variations are possible in light of the above teaching. Any or all features of the disclosed embodiments can be applied individually or in any combination are not meant to be limiting, but purely illustrative. It is intended that the scope of the invention be limited not with this detailed description, but rather determined by the claims appended hereto.

The invention claimed is:

1. A laser comprising:
   an active region surrounded by first and second waveguide layers, the active region extending along a light-propagation direction of the laser;
   two or more mask openings formed within a dielectric layer on a surface parallel to the active region, the mask openings extending normal to the light-propagation direction and spaced apart in the light-propagation direction of the laser, the mask openings modulating a current flow into the active region; and
   a refractive grating comprising epitaxially grown, three-dimensional, individual nano-stripes formed out of the mask openings, the nano-stripes separated and spaced apart in the light-propagation direction of the laser, the separation and geometry of the nano-stripes providing modulation of a real part of an effective refractive index of the laser.

2. The laser of claim 1, wherein the mask openings expose regions of a waveguide or cladding layer for selective area epitaxial growth of the refractive grating.

3. The laser of claim 1, wherein the nano-stripes comprise trapezoidal cross-sections.

4. The laser of claim 1, wherein the nano-stripes comprise rectangular cross-sections.

5. The laser of claim 1, wherein the mask openings align with a center of the nano-stripes and are narrower than the nano-stripes in the light-propagation direction.

6. The laser of claim 1, wherein the active region, first and second waveguide layers, and three-dimensional refractive grating are formed of III-V semiconductors.

7. The laser of claim 6, wherein the III-V semiconductors are selected from a group consisting of AlGaN, AlGaInN, AlGaInAs, AlGaInP, and AlGaInSb.

8. The laser of claim 1, wherein the dielectric layer is formed of $SiO_2$.

9. The laser of claim 1, further comprising an electron blocking layer between one of the first and second waveguide layers and the dielectric layer.

10. The laser of claim 1, further comprising a conductive cover layer over the nano-stripes, the cover having a different refractive index than the refractive grating and filling in gaps between the nano-stripes.

11. The laser of claim 10, wherein the conductive cover layer has a lower refractive index than that of the refractive grating.

12. The laser of claim 10, wherein the conductive cover layer is in contact with the dielectric layer.

13. The laser of claim 10, wherein the conductive cover layer is formed of ITO.

14. The laser of claim 1, wherein the nano-stripes extend beyond the edges of the mask openings in the light propagation direction.

15. The laser of claim 1, wherein the nano-stripes comprise surfaces facing away from the active region that are atomically smooth.

16. The laser of claim 1, wherein the nano-stripes comprise triangular cross-sections.

17. A method, comprising:
   injecting current into epitaxial layers of a laser, the epitaxial layers including an active region surrounded by first and second waveguide layers, the active region extending along a light-propagation direction of the laser;
   modulating a current flow into the active region via two or more mask openings formed within a dielectric layer on a surface parallel to the active region, the mask openings extending normal to the light-propagation direction and spaced apart in the light-propagation direction of the laser; and
   modulating a real part of an effective refractive index of the laser via a refractive grating formed on the mask openings, the refractive grating comprising individual, epitaxially-grown, three-dimensional nano-stripes formed out of the mask openings that are separated from one another and spaced apart in the light-propagation direction of the laser, the separation and geometry of the nano-stripes providing modulation of the real part of an effective refractive index of the laser.

18. The method of claim 17, wherein the mask openings expose regions of a waveguide or cladding layer for selective epitaxial growth of the refractive grating.

19. The method of claim 17, further comprising confining electrons in the active region via an electron blocking layer between one of the first and second waveguide layers and the dielectric layer.

20. The method of claim 17, wherein the laser further comprises a conductive cover layer over the nano-stripes, the cover having a different refractive index than the refractive grating and filling in gaps between the nano-stripes.

* * * * *